Dec. 15, 1970 I. P. BREIKSS 3,548,328

DIGITAL FM DISCRIMINATOR

Filed Jan. 13, 1969 2 Sheets-Sheet 1

INVENTOR.
IVARS P. BREIKSS
BY [signature]
ATTORNEY.

INVENTOR.
IVARS P. BREIKSS
BY
J. Donald Weber Jr.
ATTORNEY.

United States Patent Office 3,548,328 Patented Dec. 15, 1970

3,548,328

DIGITAL FM DISCRIMINATOR

Ivars P. Breikss, Littleton, Colo., assignor to Honeywell Inc., Minneapolis, Minn., a corporation of Delaware Filed Jan. 13, 1969, Ser. No. 790,531
Int. Cl. H03d 3/04
U.S. Cl. 329—126 10 Claims

ABSTRACT OF THE DISCLOSURE

There is provided an FM discriminator which utilizes digital techniques. Logic circuitry is used to operate on an FM input signal along with other predetermined signals to produce digital representations of the information included in the FM signal. In addition, circuitry is provided to convert the digital signal into an analog representation of the FM signal information.

This invention relates to a discriminator circuit which operates upon FM input signals to detect the information represented by the modulation or modulating signal applied to the FM input. More particularly, the circuit operates in a digital fashion to produce an output signal representative of the input information in either digital or analog form.

Many discriminator circuits are known in the art. However, most of these signals operate on a non-digital or, at best, a partially digital technique. These known circuits convert the FM signal, including the information, thereon to waveforms which, in the past have exhibited large scale overshoot and large scale ringing. Each of these phenomena is undesirable inasmuch as error is introduced into the operation of the circuit and much slower operation is achieved.

In the discriminators which are presently known, operation with different, i.e. multiple, center frequencies is extremely cumbersome. In order to accomplish this type of operation with the known discriminators, it is frequently necessary that several components be modified. The modification may be effected by changing the component, changing a plug in module, changing hardware or the like. The components which are modified are usually found in at least the constant pulse width generating circuitry and the filters, either active or passive, which are used in the output of the discriminator. In theory, modification of components in either the constant pulse width circuitry or the filters should be enough to change the center frequency. However, in practice, it is well known that circuitry must be provided to allow individual zero adjustment for each center frequency. This is required because exact pulse width doubling or modification is not possible when the center frequencies are changed. In addition, the filters are found to vary with regard to insertion loss and cut-off frequencies. Precision filters with the same characteristics are extremely expensive and difficult to produce.

In contrast to the "constant width pulse" type discriminator, the digital FM discriminator output is a stepwise reconstruction of the modulation. For this reason, if the carrier frequency to data frequency ratio is sufficiently high, filtering the output is not required. As this ratio becomes small, filtering may be required even in the digital FM discriminator. However, the amplitude of the carrier frequency component in the output of the digital discriminator is lower than detected in present FM discriminators.

In addition, in the known and existing discriminators, a change in the center frequency requires a modification in the length of the pulse generated by the constant pulse width generator and a modification in the cut-off frequency of the filter at the output of the discriminator. In the digital discriminator, the pulse length modification is simply and easily accomplished by changing the clock frequency. The clock frequency can be changed by a large or small amount to cause a similar large or small change in the center frequency of the discriminator. Inasmuch as the clock generator is external to the discriminator and common to all channels of the systems, changing the center frequency is accomplished simply and without modification of any parts within the discriminator. Moreover, as noted supra, filters may not be required at all. In the event that filters are required, switching thereof is much simplified inasmuch as the filters themselves are relatively simple in configuration.

In addition, the presently known, state of the art, discriminators provide only analog output signals. In contrast, the digital FM discriminator described herein, produces both analog and digital outputs. In addition, the digital signals may be in serial or parallel format.

Furthermore, in the existing discriminators, the filters, active or passive, which are constructed to meet the requirements of the known discriminators require compromises between phase shift, pass band ripple and cutoff characteristics. Each of these compromises adversely effects the operation of the circuit and the signal produced. For example, compromising at the phase filter, causes a change in the characteristics of the output signal. In addition, ringing of the filter causes overshoot in the case of a squarewave signal. Moreover, when the data signal approaches the upper limit of the filter all repetitive input signals tend to be reproduced as a sine wave. Inasmuch as most repetitive signals, which are normally measured, occur in waveshapes other than sine waves, and since the output tends to approximate a sine wave, obvious difficulties and shortcomings occur.

In order to overcome the shortcomings, the instant invention was developed. In this invention substantially totally digital operation is utilized. The FM signal is utilized to provide a control signal as a function of the period thereof. A clock signal of uniform frequency of operation produces signals which are counted during the FM period and interpreted relative to a fixed number of counts to determine, in normalized form, a signal representative of the input information contained in the FM input signal. The clock signal is further used to generate control signals which control the counting and evaluation of the signals supplied from the clock source to the signal counter.

Thus, it is one object of this invention to provide an FM discriminator circuit.

Another object of this invention is to provide an FM discriminator circuit which is substantially digital in operation.

Another object of this invention is to provide a digital FM discriminator which permits operational flexibility through the ability of adjusting portions thereof readily.

Another object of the invention is to provide an FM digital discriminator circuit which includes an arithmetic unit for substantially continuously operating upon signals representative of input information to produce digital output information representative thereof.

These and other objects are advantages of the invention and will become more readily apparent when the following description is read in conjunction with the attached drawings, in which.

Figures 1, 2:
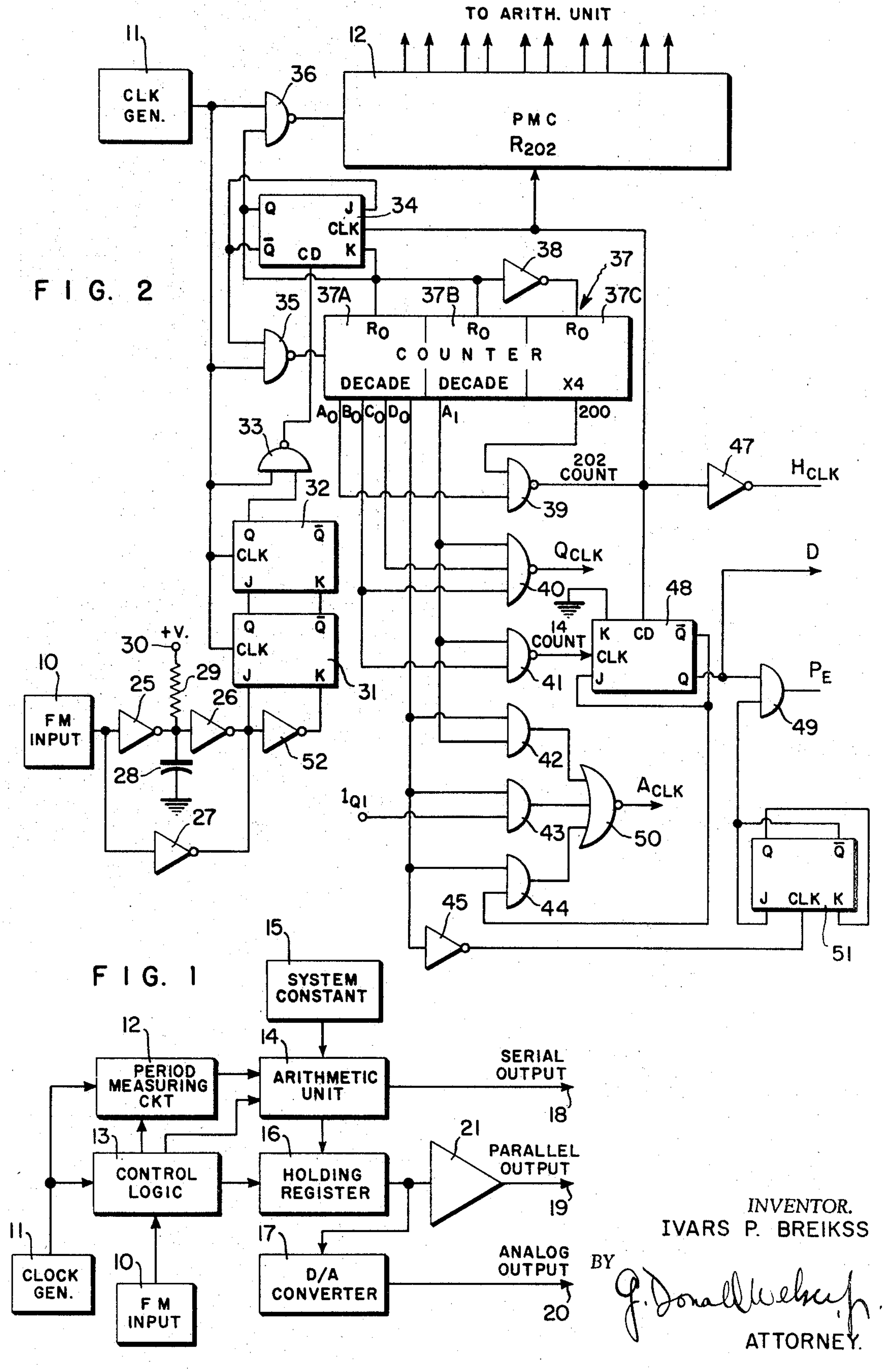
FIG. 1 is a block diagram of the system incorporated in the present invention.
FIG. 2 is a more detailed block diagram of a portion of the system shown in FIG. 1.

For purposes of description of a preferred embodiment of the invention, similar components bear similar reference numerals throughout. In addition, for convenience, a signal convention is adopted wherein a logical "1" is defined to be positive, for example +5 volts, while a logical "0" is defined to be negative, for example 0 volt. Of course, a different convention could be adopted.

Referring now to FIG. 1, there is shown a block diagram of the system utilized in the instant invention. In this system, the FM input signal which is to be operated upon is supplied by the FM input source 10. The signal from FM input source 10 is supplied to one input of control logic circuit 13. Clock signals produced by clock generator 11 are selectively supplied to period measuring circuit 12. Alternatively, the clock signals produced by clock generator 11 are supplied to control logic circuit 13 when not supplied to the periodic measuring circuit 12. Thus, as will become more apparent hereinafter, period measuring circuit 12 is ultimately controlled by the FM input signal supplied via control logic circuit 13 whereby period measuring circuit 12 counts clock signals (or pulses) produced during an FM signal period. Obviously, the clock pulses are of much higher frequency than the FM signal.

Outputs of control logic circuit 13 are also connected to inputs of arithmetic unit 14. Other inputs of arithmetic unit 14 are connected to the outputs of period measuring circuit 12. A further input to arithmetic unit 14 is supplied by system constant source 15 which supplies a signal which may be a constant. This signal may be in the form of a binary number. Arithmetic unit 14 operates upon the signal supplied by control logic circuit 13, period measuring circuit 12 and system constant source 15 in order to produce appropriate output signals. One output signal supplied by arithmetic unit 14 is a "serial" output signal which is produced at terminal 18. Thus, an output signal representative of the input signal is supplied in digital form and in the serial format. That is, a plurality of pulses are supplied in series for operation by a suitable output device.

Arithmetic unit 14 also supplies an output signal to holding register 16. Holding register 16 also receives signals from control logic circuit 13. Holding register 16 operates upon these signals and supplies a digital representation of the FM input signals, via buffer 21, to output terminal 19. That is, a digital representation of the information contained in the FM input signal is presented in parallel wherein all of the digital information for a particular operation is presented simultaneously. Buffer 21 is utilized to prevent reverse signal transmission from terminal 19 to holding register 16 and to prevent load changes or noise from interfering with the operation of arithmetic unit 14.

The parallel, digital output signal from holding register 16 is further applied to digital to analog (D/A) converter 17. The output of D/A converter 17 is supplied to analog output terminal 20 and is an analog output signal which is representative of the input information included in the FM signal. For example, the analog output signal supplied at terminal 20 represents the modulating signal which was supplied to the input signal originally produced.

In operation, the FM signal is supplied by a suitable FM input device 10. For example, the input information may be supplied by an FM recording device or the like. This signal is supplied to control logic circuit 13. In a preferred embodiment, the leading or rising edge of each FM pulse is utilized to trigger a flip-flop in logic circuit 13. In essence, the triggering of logic circuit 13 alternately enables or disables period measuring circuit 12 to permit counting thereby or not as the case may be.

Clock generator circuit 11 produces clock signals which are of a uniform and constant frequency. As noted, period measuring circuit 12 operates to count the clock pulses supplied thereto during each FM period. Thus, while the FM input sginals may typically be varying instantaneously due to the modulated input signal, the rising edge thereof triggers control logic circuit operation. During the FM signal, i.e. between rising edges of the FM signal, the period measuring circuit 12 counts the constant frequency clock pulses which have been supplied thereto. Consequently, if the FM period varies, the number of clock pulses counted by measuring circuit 12 will vary as well.

Clock generator 11 further supplies clock pulses to control logic circuit 13 which circuit operates upon the clock signals to produce suitable control logic signals for controlling the operation of the components associated therewith. As will be seen, the clock pulses are also counted and produce control logic signals at predetermined counts. One of the control logic signals is supplied to the flip-flop aforementioned and changes the operating state thereof whereby the counting period of period measuring circuit 12 (PMC) is controlled.

Thus, an FM input signal supplied to control logic 13 will produce a signal which applies the clock generator output 11 to period measuring circuit 12 to be counted thereby. Period measuring circuit 12 will count the clock signals until another signal is produced by control logic circuit 13 in response to an FM input signal supplied by FM input 10. For example, the rising edge of an FM input signal may trigger control logic circuit 13 to produce an enabling signal at period measuring circuit 12 such that clock pulses may be counted thereby. The subsequent rising edge of the FM input signal will cause control logic circuit 13 to produce another signal wherein period measuring circuit 12 is disabled relative to counting clock pulses. In this latter condition, clock signals supplied by clock generator 11 are supplied to control logic circuit 13 and counted thereby. As noted supra, clock generator 11 has a frequency which is much greater than the frequency of the FM signal supplied by FM input 10. Therefore, control logic circuit 13 will, upon the application of a suitable number of clock signals, produce another control logic signal which is supplied to an input arithmetic unit 14.

It should be noted that the signal stored in period measuring circuit 12 when operation of period measuring circuit 12 is terminated are also supplied to arithmetic unit 14. The system constant signal which may be in the form of a number in binary, biquizary, decimal or similar code, is also supplied to arithmetic unit 14. Under the control of the control logic signal supplied to arithmetic unit 14, the system constant signal or the PMC signal are applied to the arithmetic unit 14 in a prescribed sequence. Arithmetic unit 14 operates upon the respective signals and produces an output signal which is representative of the input signals and the function performed thereupon. Typically, the signal may be produced at serial output terminal 18 which would thus provide a plurality of pulses in series. A suitable output device can utilize these signals. It should be understood that arithmetic unit 14 can, under control of logic signals, generate internal signals which are operated upon.

The output signal from arithmetic unit 14 can be supplied to holding register 16 such that the application of a control signal from control logic circuit 13 causes the signals in arithmetic unit 14 to be transferred concurrently. Thus, a parallel type transfer is effected. Holding register 16 may include a plurality of flip-flops or the like which are clocked by a signal from logic circuit 13 to store the signal supplied by arithmetic unit 14.

The output from holding register 16 is supplied to an input of buffer 21 and D/A converter 17. Buffer 21 operates to isolate the circuit from output terminal 19 and any circuit connected thereto. The parallel output from holding register 16 is supplied to parallel output terminal 19 where a suitable output or utilization device may make use thereof.

The signals supplied to D/A converter 17 are, of course, presented by a parallel type transfer. D/A converter 17 is, effectively, always "on-line" wherein updating thereof can be effected via holding register 16. However, holding register 16 only receives information when a control signal from logic circuit 13 is produced. By suitably controlling the presentation of the "up-date" control signal, tape flutter correction can be achieved. Typically, the up-date control signal can be controlled by a suitable synchronization circuit similar to the instant discriminator. The output signal from D/A converter 17 is supplied to analog output terminal 20 where a suitable utilization device makes use thereof. The output signal at terminal 20 may be in the form of a current or voltage signal depending upon the output stage of D/A converter 17.

Referring now to FIG. 2, there is shown in more detail a diagram of a portion of the instant invention. Clock generator 11 is connected to an input of each of NAND gates 33, 36 and 35. In addition, the output of clock generator 11 is connected to the clock input of each of flip-flops 31 and 32. FM input source 10 is connected to the inputs of inverters 25 and 27. The output of inverter 25 is connected to the junction between resistor 29 and capacitor 28. Resistor 29 and capacitor 28 are connected in series between source 30 (which supplies approximately +5 volts) and ground or other suitable reference source. The output of inverter 25 is further connected to an input of inverter 26. The outputs of inverters 26 and 27 are connected together and to the J injut of flip-flop 31 and, via inverter 52, to the K input of flip-flop 31. The Q and $\overline{Q}$ outputs of flip-flop 31 are connected to the J and K inputs of flip-flop 32, respectively. The $\overline{Q}$ output of flip-flop 32 is not connected. The Q output of flip-flop 32 is connected to another input of NAND gate 33. The output of NAND gate 33 is connected to the $C_D$ input, which is one of the asynchronous inputs of control flip-flop 34. The clock (CLK) input of control flip-flop 34 is connected to the 202 count output of gate 39 as will be explained hereinafter. The Q and $\overline{Q}$ outputs of flip-flop 34 are interconnected to the K and J inputs thereof, respectively. In addition, the $\overline{Q}$ output of flip-flop 34 is connected to another input of gate 35 while the Q output of flip-flop 34 is connected to another input of gate 36. The output of gate 36 is connected to the period measuring circuit (PMC) 12. The output of NAND gate 35 is connected to an input of counter 37 which will be described hereinafter.

The input signal supplied by source 10 is a typical FM signal including variable frequency modulation to supply input information. This signal is supplied to inverters 25 and 27 concurrently. The inverters 25 and 27, along with inverter 26, provide a "one-shot" circuit which produces a single, uniform signal in response to each negative going signal at the input. Thus, as the FM signal provided by source 10 switches from a logical one to a logical zero, i.e. a negative going signal edge, the output of inverter 27 switches substantially instantaneously to a logical "1" signal. This logical "1" signal is supplied at the junction between the output of inverter 26 and the input of inverter 52. This junction is also connected to the J input of flip-flop 31. However, the output of inverter 25 cannot switch instantaneously to a high level signal inasmuch as capacitor 28 provides an inherent, built-in, time delay while the capacitor is being charged. Ultimately, when capacitor 28 reaches a predetermined charge level and exhibits a predetermined voltage thereacross, inverter 26 will be triggered and produce a low level signal at the output thereof which will clamp the output of inverter 27. Thus, a single pulse is produced by the negative going FM signal. The single pulse has a duration which is controlled by the RC network comprising resistor 29 and capacitor 28. Typically, the signal duration is about 50–100 nanoseconds. Inverter 52 serves to assure that the J and K inputs of flip-flop 31 receive complement signals.

Thus, it is seen that a logical one of a predetermined duration is supplied to the J input of flip-flop 31. Inasmuch as the clock signal supplied by the clock generator 11 is of relatively high frequency compared to the FM input, at least one clock signal will be supplied to flip-flop 31 while the positive signal is applied at input J. The clock pulse applied to flip-flop 31 will cause a logical "1" signal to be propagated through flip-flop 31 and appear at the Q output. Simultaneously, the $\overline{Q}$ output will produce a logical "0" signal. These signals are connected to the J and K inputs of flip-flop 32, respectively. Upon the presentation of the next clock signal, these signals will be again propagated through flip-flop 32 to produce a logical "1" signal at the Q output of flip-flop 32. The $\overline{Q}$ output signal will be a logical "0," but is inconsequential at this juncture. The logical "1" signal at the Q output of flip-flop 32 is supplied to NAND gate 33. At the next clock pulse, NAND gate 33 will produce a logical "0" output which is supplied to the $C_D$ input of control flip-flop 34. This input has the effect of producing a logical "1" signal at the $\overline{Q}$ output. The $\overline{Q}$ signal is applied to an input of gate 35 to enable same whereby clock pulses from clock generator 11 can be supplied to counter 37.

As will be described hereinafter, counter 37 will produce count signals. Gate 39 will produce an output signal representative of the count of 202 clock pulses. This output signal will be returned to the clock (CLK) input of control flip-flop 34. The CLK signal will cause the J and K input signals to be transferred to the Q and $\overline{Q}$ outputs, respectively. Thus, the J input (connected to $\overline{Q}$ output and a "1") will cause Q to become a "1." Similarly, the K input will cause $\overline{Q}$ to become a "0." Thus, gate 36 will be enabled and gate 35 will be disabled at the 202 count.

The next rising edge of the FM signal causes a similar operation of the one shot circuit comprising inverters 25, 26 and 27. In addition, flip-flops 31 and 32 are effective to supply signals in accordance with the clock pulses supplied thereto. Again, a logical "1" is supplied to gate 33 from flip-flop 32. With the next clock pulse after the application of the logical "1" signal to gate 33, a logical "0" signal is applied to the $C_D$ input of control flip-flop 34 and, again, has the effect of switching the operation thereof. Thus, the $\overline{Q}$ signal of flip-flop 34 becomes a logical "1" signal and enables gate 35 while the Q signal of flip-flop 34 becomes a logical "0" signal and gate 36 is disabled. Again, this operation causes clock pulses to be fed from clock generator 11 to counter 37 via gate 35 and the operational cycle resumes. While counter 37 is counting, the previous count in PMC 12 (obtained while gate 36 was enabled) is provided at the outputs thereof and supplied to the arithmetic unit via the parallel output lines shown.

Counter 37 may, in a preferred embodiment, comprise two decade counters 37A and 37B. In addition, a times four counter 37C is included. Thus, since the counters are connected in series, the full output count from counter 37C represents a count of 400 clock pulses. In addition, individual outputs of the counters are connected to the gates as shown. To determine the operation of the gates, reference is made to the following truth table.

TRUTH TABLE

| Count | Output | | | | Count | Output | | | | Count | Output | |
|---|---|---|---|---|---|---|---|---|---|---|---|---|
| | $D_0$ | $C_0$ | $B_0$ | $A_0$ | | $D_1$ | $C_1$ | $B_1$ | $A_1$ | | $B_2$ | $A_2$ |
| 0 | 0 | 0 | 0 | 0 | 00 | 0 | 0 | 0 | 0 | 000 | 0 | 0 |
| 1 | 0 | 0 | 0 | 1 | 10 | 0 | 0 | 0 | 1 | 100 | 0 | 1 |
| 2 | 0 | 0 | 1 | 0 | 20 | 0 | 0 | 1 | 0 | 200 | 1 | 0 |
| 3 | 0 | 0 | 1 | 1 | 30 | 0 | 0 | 1 | 1 | 300 | 1 | 1 |
| 4 | 0 | 1 | 0 | 0 | 40 | 0 | 1 | 0 | 0 | | | |
| 5 | 0 | 1 | 0 | 1 | 50 | 0 | 1 | 0 | 1 | | | |
| 6 | 0 | 1 | 1 | 0 | 60 | 0 | 1 | 1 | 0 | | | |
| 7 | 0 | 1 | 1 | 1 | 70 | 0 | 1 | 1 | 1 | | | |
| 8 | 1 | 0 | 0 | 0 | 80 | 1 | 0 | 0 | 0 | | | |
| 9 | 1 | 0 | 0 | 1 | 90 | 1 | 0 | 0 | 1 | | | |

For example, NAND gate 39 has two inputs connected ot the $A_0$ or count 1 output of decade counter 37A and another output connected to the 200 output of counter 37C. Thus, gate 39 will produce an output signal every 202 clock pulses. That is, one input will be applied when the output from counter 37C indicates a count of 200. The next clock pulse will revert the decade counters to zero and the next pulse will produce a "1" at the output OA whereby gate 39 produces an output signal in response to a count of 202 clock pulses. This output signal is connected, inter alia, to the clock input of flip-flop 34. In addition, the 202 output from gate 39 is applied to the reset 202 input of PMC 12 and the CD input of flip-flop 48. As will be described hereinafter, the R202 input to PMC 12 has the effect of inserting a count of 202 into PMC 12 whereby overlap operation of PMC 12 and counter 37 is effected. That is, while gate 35 is enabled and passing pulses therethrough to counter 37, gate 36 is disabled and no clock pulses are supplied to PMC 12. Consequently, when the 202 count pulse is applied to flip-flop 34 to transfer the J–K input signals to the output terminals, the status of gate 35 and 36 is reversed whereby signals are applied to PMC 12. However, PMC 12 has not received any pulses during the operation of counter 37. However, the 202 output signal causes PMC 12 to begin counting at the 202 level. It should be noted, that PMC 12 may comprise a plurality of J–K flip-flops connected in a usual fashion to produce a suitable counting circuit. These flip-flops are connected such that the 202 signal inserts a count of 202 in PMC 12.

In addition, the 202 count is supplied to inverter 47 which inverts the logical "0" signal of the count 202 signal to produce a logical "1" signal designated as H–CLK which is used to control holding register 16 shown in FIG. 3 and described hereinafter.

NAND gate 41 has one input connected to the output terminal A1 of the second decade counter 37B. In addition, the other inputs of gate 41 are connected to the B0 output terminal of the first decade counter 37A. This combination of signals satisfies gate 41 during the period between the 12 through 14 counts. That is, output A, becomes a logical "1" at the tenth count and remains a logical "1" through the twentieth count. Output $B_0$ becomes a logical "1" every 2 and 3 counts; and 6 and 7 counts. For this reason NAND gate 41 has a logical "1" on both of its inputs, for the first time, at count 12. Therefore at count 12 the output of NAND gate 41 switches from a logical "1" to a logical "0."

The 12 count output signal of gate 41 is applied to the CLK input of flip-flop 48. It should be noted at this time, that flip-flop 48 is triggered on the falling edge of the 12th count. Thus, this signal causes flip-flop 48 to change state such that the Q output of flip-flop 48 becomes a logical "1" and the $\overline{Q}$ output becomes a logical "0." The K input of flip-flop 48 is connected to ground while the J input is connected to the $\overline{Q}$ output thereof along with one input of AND gate 44. The Q output of flip-flop 48 is connected to one input of NAND gate 49 which produces the $P_E$ signal which is utilized in the circuitry of FIG. 3 as described hereinafter. In addition, the Q output of flip-flop 48 is connected to terminal D to provide a control signal. Terminal D is connected to multiplexer 79 and gate circuit 99. The control signal at terminal D causes the selection of the switching arrangement at multiplexer 79 and supplies the $C_{IN}$ signal at adder 81. The $C_{IN}$ signal is either a logical "1" or a logical "0" as a function of the Q signal supplied to terminal D.

Two inputs of AND gate 40 are connected to the B0 and C0 outputs, respectively, of decade counter 37A and and a further input of gate 40 is connected to the A1 output of decade counter 37B. Gate 40 is connected to a produce signal designated $Q_{CLK}$ which is applied to circuitry shown in FIG. 3 and controls the operation of Q register 85, as described hereinafter. Examination of the Truth Table supra indicates that logical "1" inputs are supplied to all of the inputs of gate 40 at counts 16, 17, 36, 37, 56, 57, 76, 77, 96 and 97. This cycle is repeated during the 100–200 counts whereby ten $Q_{CLK}$ signals are generated during a 202 count cycle where each $Q_{CLK}$ signal is two counts in duration.

Gate 50 is a NOR gate which selectively produce the output signal $A_{CLK}$. The inputs of gate 50 are connected to the outputs of AND gates 42, 43 and 44, respectively. Gate 50 produces a logical "1" output signal when each of the input signals supplied thereto is a logical "0." Conversely, if any one of gates 42, 43 or 44 produces a logical "1" output signal, gate 50 produces a logical "0" output signal. As will be seen, the $A_{CLK}$ signal produced by gate 50 is supplied to A register 83 (FIG. 3) to control the operation thereof.

Gate 42 has the two inputs thereof connected to terminals D0 and A1 of decade counters 37A and 37B, respectively. From the Truth Table, it is apparent that the inputs to gate 42 both are logical "1" at counts 18, 19, 38, 39, 58, 59, 78, 79, 98 and 99. Of course, for each 202 count cycle this sequence is repeated. Thus, a logical "1" is supplied to an input of NOR gate 50 at the counts indicated.

Gate 43 has one input connected to the D0 terminal of decade counter 37A and the other input connected to the 1Q1 terminal. As seen from the Truth Table, gate 43 receives a logical "1" signal during counts 8 and 9. Thus, if and only if, a logical "1" is present at the 1Q1 terminal, gate 43 applies a logical "1" signal at the input of gate 50. As will be seen hereinafter, the 1Q1 signal is a logical "1" in response to a logical "1" signal being supplied at the appropriate location in Q register 85.

Gate 44 has one input connected to the D0 terminal of decade counter 37A and the other input connected to the $\overline{Q}$ output of flip-flop 48. Gate 44 supplies a logical "1" signal to an input of gate 50 at counts 8 and 9, if and only if the $\overline{Q}$ signal from flip-flop 48 is a logical "1." As will be seen hereinafter, the $\overline{Q}$ signal is a logical "1" during the interval between a 202 count (gate 39) and the following 12 count (gate 41).

The D0 output of decade counter 37 is connected via inverter 45 to the clock (CLK) input of flip-flop 51. The J and K inputs of flip-flop 51 are connected to the $\overline{Q}$ and Q outputs of flip-flop 51, respectively. The $\overline{Q}$ output of flip-flop 51 is further connected to an input gate 49 which produces the $P_E$ signal noted supra. Thus, gate 49 produces a $P_E$ signal which is a logical "1" only when the Q output of flip-flop 48 and the $\overline{Q}$ output of flip-flop 51 is each a logical "1" signal concurrently. Since the $\overline{Q}$ output of flip-flop 51 alternates every 20 counts (i.e. the D0 signal changes the state of flip-flop 51 every 10 counts) and the Q output of flip-flop 48 is a logical "1" between the 14 and 202 counts, the $P_E$ signal is a logical "1" only periodically between the 20 and 202 counts.

Inasmuch as gates 42, 43 and 44 are AND gates, application of concurrent logical "1" signals to all of the inputs of the individual gates are required in order to produce a logical "1" output signal. Gate 50, however, is a NOR gate which requires that each of the input signals be a logical "0" in order to obtain a logical "1" output signal, while any logical "1" input will produce a logical "0" output signal therefrom.

Thus, as clock pulses are applied to counter 37, output signals from the respective sections thereof are applied to gates 39 through 44 in conjunction with signals from other portions of the systems, as noted. The output signals produced by the gating network are supplied to the circuits noted to control the operation thereof. These signals are applied in the proper sequence to properly control the circuits and to produce other signals that are required.

Figure 3:
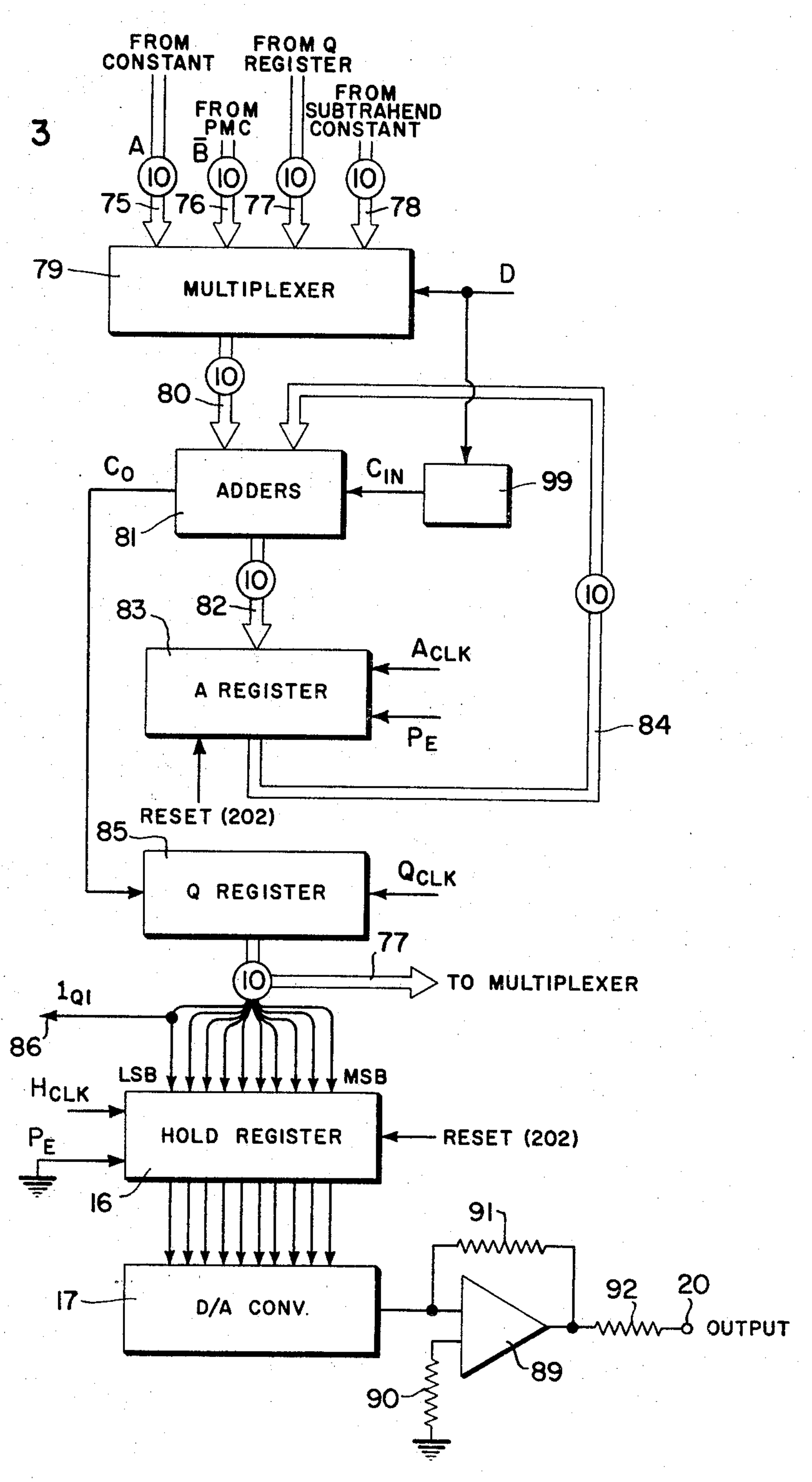
FIG. 3 is another more detailed block diagram of the remainder of the system shown in FIG. 1.

Referring now to FIG. 3, there is shown a block diagram of the arithmetic unit and the output portions of the circuit. Multiplexer 79 has at least two functional inputs supplied thereto. In a preferred embodiment, four functional inputs are supplied to the multiplexer. Each of these functional inputs includes 10 separate input lines. Neither the number of input lines nor the number of functional inputs is limitative of the invention. The input signals designated A are supplied along cable 75 and represent the signals supplied by system constant source 15 shown in FIG. 1. These signals are inserted into the operation in order to "normalize" or linearize the operation of the circuits as described hereinafter. The $\overline{B}$ signals supplied along cable 76 are produced by PMC 12 and represent the clock pulses which have been counted by and stored in PMC 12. In a preferred embodiment, the number represented by the A signals is larger than the maximum number represented by the $\overline{B}$ signals.

The arithmetic unit is required to provide a linearized operation. That is, the frequency of the FM signal produced by FM input 10 represents the instantaneous amplitude of the modulating signal. Period measuring circuit 12 measures the period of each FM carrier cycle. As shown in the following table, the frequency of the FM signal is a linear function of the percent deviation from the center frequency. However, the period (measured by PMC 12) is not a linear function of the deviation. However, by dividing a constant (i.e. a signal provided by system constant source 15) by the period, a signal is produced which is, again, a linear function of the deviation. In the table, a nondeviated center frequency of 100 Hz. is assumed.

| Center freq. plus percent dev. | Freq. | Period ($\times 10^{-4}$) | Const./ period |
|---|---|---|---|
| $f_0$+40% | 140 | 71 | 1.4 |
| $f_0$ | 100 | 100 | 1.0 |
| $f_0$−40% | 60 | 166 | 0.6 |

In one embodiment of the invention, signals from the Q register are supplied along cable 77 while a further constant, the subtrahend constant, is supplied along cable 78. The subtrahend constant is supplied by any suitable source (not shown). The latter two inputs are not required for operation of the circuit but provide a more desirable operation. The control signal D is supplied to multiplexer 79 to determine which of the signals are to be connected therethrough. Multiplexer 79 may be considered as a plurality of rotary switches wherein the output of multiplexer 79 is selectively connected to one of the inputs 75 through 78 in accordance with the signals supplied at D. In a preferred embodiment, multiplexer 79 is an electronic circuit which controls the interconnection of the inputs to output cable 80.

Cable 80 carries the individual outputs of multiplexer 79 to the inputs of adder 81. A carry input designated as $C_{IN}$ provides a logical "1" signal to adder 81. The carry output signal, designated $C_0$, is connected to the input of Q-register 85 to supply signals thereto in serial form. The outputs of adder 81 are connected via cable 82 to A-register 83. Cable 82 provides a transmission path wherein signals are transmitted from adder 81 to A-register 83. Cable 84 is connected between the output of A-register 83 and further inputs of adder 81 wherein the output of A-register 83 is connected to the inputs of adder 81 such that information stored in A-register 83 may be selectively added to information signals supplied to adder 81 by multiplexer 79 via cable 80. Logic control signals are connected to inputs of A-register 83 to control the operation thereof. The A–CLK, $P_E$ and reset signals are supplied by the gating and logic circuitry shown and described relative to FIG. 2.

In addition to the $C_0$ signal, Q register 85 receives the Q–CLK signal from the logic circuitry shown in FIG. 2. The output of Q-register 85 is connected to hold-register 16. Cable 77, which includes the individual transmission lines, is shown connected to the output of Q register 85 and indicated to be returned to multiplexer 79. Cable 77 is separated into individual lines showing, inter alia, the LSB (least significant bit) and MSB (most significant bit) connected to the inputs of hold register 16. In addition, the LSB line is connected to output terminal 86 which is the 1Q1 terminal which forms an input of gate 43 of the control logic circuit shown in FIG. 2. In addition, hold-register 16 receives the H–CLK, $P_E$ and reset signals from control logic circuits shown in FIG. 2.

The outputs of hold-register 16 are connected to D/A converter 17. The ten transmission lines represent the ten signal lines which have been suggested in the other portions of the circuitry shown in FIG. 3. D/A converter 17 is any typical D/A converter known in the art which receives a digital type signal and converts it to an analog signal. A typical operational amplifier 89 has one input connected to the analog output of the D/A converter 17. Feedback resistor 91 is connected between the output and the input of amplifier 89. Another input of amplifier 89 is connected to ground or other suitable reference source via resistor 90. The output of amplifier 89 is connected via a suitable resistor 92 to output terminal 20 as shown in FIG. 1.

In operation, input signals A are typically supplied to multiplexer 79 via cable 75 in response to the proper control signal D. The A signals are supplied via cable 80 directly to adder 81 where they are operated upon. That is, the $C_{IN}$ signal is added thereto. The $C_{IN}$ signal is the only signal added thereto inasmuch as the A-register has been reset to produce all zeros at this time. Upon application of the A–CLK signal, the information in adder 81 is transferred via cable 82 and stored in A-register 83. At the same time, the $P_E$ signal produced by gates 49 in FIG. 2 is a logical "0." As will be described hereinafter, when the $P_E$ signal is a logical "1," the A–CLK signal causes A-register 83 to shift to the left one bit but inhibits input operation at the A-register.

The A–CLK signal, when the $P_E$ signal is a logical "0," causes the contents of adder 81 to be stored in A-register 83. The information stored in A-register 83 is fed back to adder 81 via cable 84. With the appropriate control signal D supplied to multiplexer 79, the $\overline{B}$ signals from PMC 12 are supplied via cable 76, through multiplexer 79 and cable 80 to adder 81.

Since the $\overline{B}$ signals are taken from the complement side of the several flip-flops in PMC 12, the $\overline{B}$ signal represents the "one's complement" of the B signal produced by PMC 12. In actuality, the B signal represents a number in base 2 (i.e. a binary number) proportional to the period of the FM signal as measured by PMC 12. The "one's complement" is converted into the "two's complement" by adding the value one (in base 2) to the "one's complement." The conversion of the "one's complement" to "two's complement" is accomplished by supplying a logical "1" to the $C_{IN}$ input of adder 81 via gate 99.

In order to execute division, it is necessary to compare the dividend and divisor. The three possible conditions which may exist, are listed herewith.

(1) The dividend is greater than the divisor.

(2) The dividend is equal to the divisor.

(3) The dividend is less than the divisor.

In arithmetic unit 14, the comparison of dividend and divisor is accomplished by adding the dividend and the "two's complement" of the divisor in adder 81. The three conditions of the dividend and divisor indicated above are detected in the following manner.

(1) If the dividend is greater than the divisor a carry output ($C_0$) of a logical "1" is generated.

(2) If the dividend is equal to the divisor, a carry output of logical "1" is generated.

(3) If the dividend is less than the divisor, a carry output of logical "0" is generated.

The $C_0$ signal is entered in Q-register 85 and forms the quotient. The most recent entry in Q-register 85 corresponds to the 1Q1 signal. The 1Q1 signal is also the result of the comparison of the divisor and dividend magnitudes as indicated above. In order to execute division, the following action on the basis of the dividend and divisor magnitude comparison must take place:

(1) If the dividend is greater than the divisor, the divisor is subtracted from the dividend and the remainder is multiplied by 2.

(2) If the dividend is equal to the divisor, the divisor is subtracted from the dividend. In this case the remainder is zero and division is, in fact, complete.

(3) If the dividend is less than the divisor, substraction is not executed and the dividend is multiplied by 2.

The above steps are repeated enough times to generate the required number of quotient digits.

The subtraction of the divisor from the dividend is accomplished by adding the "two's complement" of the divisor to the dividend. The subtraction is "recorded" by entering the result in A-register 83 only if the 1Q1 signal is a logical "1." The A-register is entered via the parallel entry lines 82 only if the $P_E$ signal is a logical "0" coincident with an A–CLK pulse.

Multiplication by 2 is accomplished by shifting the contents of A-register 83 one bit position to the left. This shift occurs only if $P_E$ is a logical "1" coincident with an A–CLK pulse.

Thus, it is seen that the signal supplied via cable 80 is added to the signal returned via cable 84, and adder 81 produces, at output cable 82, the sum of the aforesaid signals. Thus the signal supplied at cable 82 is the quantity $(A)+(\overline{B}+1)$ which is representative of the number contained in the A registers added to the two's complement of the count in the counter register. The signal A from the constant source 15 is preselected to have the proper magnitude. Gate 99 causes the $C_{IN}$ signal to be a logical "0" when the A signal is supplied to adder 81 to prevent an alteration of the reference signal. The operation of adding the A signals to the 2's complement of another information bearing signal ($\overline{B}$) has the effect of subtracting the first number from the second number and producing the remainder in adder 81. This operation is continued and ultimately effects division of the signals. Detailed analyses of this procedure is published in "Digital Computer Design Fundamentals," Yaohan Chu, McGraw-Hill (pp. 35 et seq.) or "The Logic of Computer Arithmetic," Ivan Flores, Prentice Hall (pp. 58 et seq.).

The arithmetic operation will produce carry signals at the $C_0$ output of adder 81. These signals are stored in Q-register 85 upon the application of a Q–CLK signal. That is, the carry signal $C_0$ is supplied to the least significant bit (LSB) portion of Q-register 85 and is entered thereinto with the application of the Q–CLK signal. The Q–CLK signal is produced by gate 40 as noted supra. Of course, the $C_0$ signal may be either a logical "1" or a logical "0" depending upon the result produced by the addition operation.

The output of Q-register 85 is connected via cable 77 to a further input of multiplexer 89 that will be described hereinafter. In addition, the output terminals of Q-register 85 are connected to inputs of hold-register 16. Since the $P_E$ (or parallel entry) signal is connected to ground, the application of H–CLK signal as produced by gate 39 via inverter 47 causes each of the input signals to be stored in separate stages of hold-register 16 simultaneously. That is, upon each 202 count of the clock signals supplied by clock generator 11, the output of Q-register 85 is transferred to hold-register 16 in parallel form and stored therein. The least significant bit (LSB) of the signal supplied by Q-regster 85 is applied to terminal 86 which is the 1Q1 output terminal which is returned to an input of gate 43 as described supra.

The interconnection between the output of Q-register 85 via cable 77 and multiplexer 79 is effective to return a digital representation of the information stored in the FM signal to multiplexer 79. Consequently, upon application of the proper control signal D, the output of Q-register 85 is connected to adder 81. It will be noted that this signal is indicative of an FM signal which varies only in a positive direction and, thus, includes a pedestal voltage signal. In order to remove this pedestal signal, a "subtrahend constant" signal is supplied along cable 78 from any suitable source. Upon presentation of a proper control signal D, the subtrahend signal is also supplied to adder 81 via cable 80 and multiplexer 79. The subtrahend constant and the signal from the Q-register are added and supplied to the A-register in such a fashion that the subtrahend signal is subtracted from the signal produced by Q-register 85. Thus, the constant or pedestal signal can be deleted. The signal stored in A-register 83 can then be supplied to Q-register 85 and to hold-register 16 in the normal course of operation. The signal thus stored in hold-register 16 is representative of a signal which varies about zero with no offset or pedestal voltage.

The output from hold-register 16 is continuously supplied to D/A converter 17 for operation thereby. D/A converter 17 operates upon the parallel signal from hold-register 16 to convert this digital type signal into an analog type signal. The analog signal is supplied to amplifier 89 which operates thereupon in such a fashion to produce a suitable output signal having the proper characteristics relative to magnitude and the like. Amplifier 89 is not, per se, a portion of the invention and is known in the art.

Thus, in operation, clock generator 11 supplies a relatively high frequency train of pulses. These pulses are supplied to PMC 12 or counter 37, alternatively. A suitable FM input source supplies a typical FM input signal wherein the carrier frequency is modulated by an information signal. The FM signal triggers control circuitry to determine whether the clock signals are supplied to PMC 12 or counter 37. When the signals are supplied to PMC 12, the clock pulses are counted in a typical counter fashion and the count total is stored therein. Counter 37 includes a pair of decade counters and a module counter arranged to produce output signals indicative of predetermined counts. Output signals representative of selective counts are produced by logic gates which are designated to be enabled when the predetermined counts are applied thereto from the counters. One of the predetermined output signals, the 202 count (which may be inverted to provide the H–CLK) signal is applied to PMC 12 to insert an updated count which represents the counting operation of counter 37. The 202 count signal is supplied to control flip-flop 34 to change the state thereof such that the FM signal applied by FM source 10 can provide a switching operation of flip-flop 34. In addition, the 202 signal is applied to hold-register 16 and A-register 83 to effect a reset to zero operation.

The O–CLK signal supplied by gate 40 via inverter 46 (to obtain the proper logic state) is applied to Q-register 85 at predetermined intervals so that the $C_0$ signal from adder 81 can be inserted into Q-register 85. The 12 count output from gate 41 is supplied to the clock input of flip-flop 48. In addition, the 202 count from clock 39 is supplied to the $C_D$ input of flip-flop 48. Thus, after the initial 202 count is supplied to $C_D$, the $\overline{Q}$ output supplies a logical "1" signal which is supplied to the J input. The next subsequent signal from gate 41 toggles flip-flop 48 and the J input is supplied to the Q output whereby the Q output represents a logical "1". Thus a logical "1" signal is supplied at the D control signal which is supplied to multiplexer 79 and to one input of gate 49. Thus, gate 49 is enabled to produce the $P_E$ signal between the 12 and 202 counts. However, gate 49 will produce the $P_E$ count or signal only when the $\overline{Q}$ output of flip-flop 51 is also a logical "1." Flip-flop 51 is triggered by the $D_0$ or 10 count signal from decade counter 37A via inverter 45. Thus, the $\overline{Q}$ output of flip-flop 51 is a logical "1" for alternate signals supplied via $D_0$. Therefore, every 20 count of the counters 37 will produce a logical "1" at the input of gate 49 wherein the $P_E$ signal will be generated as a logical "1" signal. The $P_E$ signal is, of course, supplied to A-register 83. When $P_E$ is a logical "1," A-register 83 operates to shift one bit to the left and add a zero in the vacated bit. On the contrary, if $P_E$ is a logical "0" in conjunction with the A–CLK signal, a parallel entry or enable signal is supplied to A-register 83 and addition via adder 81 is effected.

When the Q-CLK signal is supplied, a $C_0$ signal from adder 81 is applied to Q-register 85. As noted, the least significant bit in Q-register 85 is identified by the 1Q1 signal at terminal 86. This signal is applied to an input of gate 43 which is associated with NOR gate 50. If the 1Q1 signal is a logical "1," that is, the most recent bit entered into Q-register 85 from adder 81 is a logical "1," the A–CLK signal will ge generated and the effective addition (or subtraction) by adder 81 will occur. If, on the other hand, the 1Q1 signal is a logical "0," i.e. the previous carry $C_0$ it is logical "0," the A–CLK signal will not be generated by gate 50 and addition at the A-register 83 will not occur.

When the A–CLK signal is not produced lue to the 1Q1 signal being a logical "0," the information in adder 81 remains unchanged but is not entered into A-register 83. With the application of a $P_E$ signal which is a logical "1" the next A–CLK signal causes A-register 83 to shift the contents thereof to the left one bit. This information is then applied to adder 81 via cable 84 wherein a signal $C_0$ is applied again to Q-register 85 during the application of the Q–CLK signal. Again, the output of Q-register 85 is applied to cable 77 and the 1Q1 signal is applied, ultimately, to NOR gate 50. Again, depending upon the state of the 1Q1 signal, the A–CLK signal may be supplied to A-register 83 to cause storage therein of the signal supplied by adder 81 or, in the alternative, the A–CLK signal may not be produced wherein the output signal from adder 81 cannot be entered into and stored in A-register 83.

The subsequent A–CLK signal with the $P_E$ signal equal to a logical "1" causes another shift of A-register 83 and the process continues until a 1Q1 signal is supplied wherein NOR gate 50 produces an A–CLK signal along with a $P_E$ signal which is a logical "0" such that A-register 83 is operative to receive and store the information produced by adder 81.

It will be seen that for each cycle, where a cycle is defined, as 202 counts of the clock pulse by counter 37, there are 21 A–CLK signals. The first A–CLK signal enters the A signals along cable 75 into adders 81 via multiplexer 79 and cable 80. The second, fourth, sixth and subsequent even numbered A–CLK signals are conditional and depend upon the condition of the 1Q1 signal which is supplied to NOR gate 50. If NOR gate 50 produces the conditional A–CLK signal along with a logical "0" $P_E$ signal, the addition takes place and the information in adder 81 is transferred to and stored in A-register 83. In the event that the conditional A–CLK signal is not presented, the information in adder 81 at that time is not entered into A-register 83. However, the third, fifth and subsequent odd numbered A–CLK signals are supplied to A-register 83 along with a logical "1" $P_E$ signal wherein the contents of A-register 83 is shifted one place to the left and this information is supplied to adder 81 via cable 84. The $C_0$ output from adder 81 is connected to the input of Q-register 85 and the contents is stored in Q-register 85 with the application of a Q–CLK signal. The output of Q-register 85 is supplied to hold-register 16 with the concurrent H–CLK signal. The output of hold-register 16 is supplied to D/A converter 17 to produce an analog signal as described supra.

Thus, there has been described an FM discriminator which operates on a substantially digital principle. Since resonant elements are not used in this discriminator square wave modulation of the FM carrier is reproduced without overshoot and without ringing whereby improved operation is achieved. In the preferred embodiment described herein, it is proposed to use all integrated circuitry. However, discrete component circuitry can be utilized to implement any of the individual circuit components. For example, any of the stages of the counters or registers could be vacuum tubes, semiconductors or other suitable elements. Moreover, while the various cables show and suggest digital inputs having 10 bits, the invention is not to be limited thereby and any number of bits can be utilized depending upon the accuracy of the operation required.

The embodiments of the invention in which an exclusive property or privilege is claimed are defined as follows:

1. In combination, periodic signal supplying means, input signal supplying means, control means connected to receive signals from each of said periodic signal supplying means and said input signal supplying means, said control means exhibiting a different status according to the signals supplied thereto, counting means connected to said periodic signal supplying means and said control means, said counting means selectively counting the periodic signals supplied thereto by said periodic signal supplying means in accordance with the status of said control means, constant signal supplying means, arithmetic means connected to receive signals from said constant signal supplying means, said counting means and said control means, said arithmetic means operating upon the signals supplied thereto by said constant signal supplying means and said counting means in accordance with the status of said control means, and output means connected to said arithmetic means.

2. The combination recited in claim 1 including storage means connected between said arithmetic unit and said output means, said storage means connected to said control means and rendered operative in accordance with the status of said control means, and digital to analog converter means connected to said storage means for converting the digital signal at said storage means to an analog signal at said output means.

3. The combination recited in claim 1 including single-shot inverter means connected to said input means, and synchronizing means connected to said single-shot inverter means and said periodic signal supplying means to supply signals to said control means in synchronism with the signals produced by said periodic signal supplying means.

4. The combination recited in claim 1 wherein said control means includes counter means, first gating means selectively connecting said periodic signal supplying means to said counter means, second gating means selectively connecting said periodic signal supplying means to said counting means, said control means includes control flip-flop means, said input means connected to said control flip-flop means to determine the state thereof, said first and second gating means connected to said control flip-flop and selectively enabled thereby, and means connecting said counter means to said control flip-flop whereby the state of said control flip-flop is changed at a predetermined count at said counter means and the conditions of said first and second gating means are reversed.

5. The combination recited in claim 4 including a plurality of switch means, said switch means connected to said counter means and operative to produce output signals in response to predetermined counts at said counter means.

6. The combination recited in claim 1 wherein said arithmetic means includes multiplexer means, separate input terminals of said multiplexer means connected to said constant signal/supplying means, said counting means and said storage means, said control means supplying control signals to said multiplexer means to select the input terminal which is rendered active for operation by said multiplexer, adder means connected to the outputs of said multiplexer means, and A-register means connected to said adder means to store the output signal produced by said adder means.

7. The combination recited in claim 6 including feedback means from said A-register to said adder means, and converter means connected to an input of said adder means, said converter means connected to said control means to selectively supply a signal to said adder means to convert the signal thereat.

8. The combination recited in claim 7 including Q-register means connected to an output of said adder means, said storage means connected to the outputs of said Q-register means to store the signals produced by said Q-register means, said control means supplying signals to each of said Q-register means and said storage means to selectively control the operation thereof.

9. The combination recited in claim 5 including first bistable means having a first control input connected to one of said switch means and a second control input connected to said means connecting said counter means to said control flip-flop means, second bistable means having a control input connected to said counter means, further gate means having the inputs thereof connected to outputs of said first and second bistable means, said further gate means having the output thereof connected to said arithmetic means to control a storage function therein.

10. The combination recited in claim 9 including a NOR gate, a plurality of said switch means supplying signals thereto, one of said switch means receiving an input signal from said arithmetic means, a further one of said switch means receiving an input signal from said first bistable means.

References Cited

UNITED STATES PATENTS

| | | | |
|---|---|---|---|
| 2,992,384 | 7/1961 | Malbrain | 328—48X |
| 3,447,149 | 5/1969 | Groth | 340—347 |
| 3,490,049 | 1/1970 | Choquet | 329—126 |

ALFRED L. BRODY, Primary Examiner

U.S. Cl. X.R.

328—41, 109; 340—347